United States Patent
Kobata

(10) Patent No.: US 10,992,260 B2
(45) Date of Patent: Apr. 27, 2021

(54) OSCILLATOR DEVICE

(71) Applicant: NIHON DEMPA KOGYO CO., LTD., Tokyo (JP)

(72) Inventor: Tsukasa Kobata, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/981,706

(22) PCT Filed: Mar. 25, 2019

(86) PCT No.: PCT/JP2019/012521
§ 371 (c)(1),
(2) Date: Sep. 17, 2020

(87) PCT Pub. No.: WO2019/188990
PCT Pub. Date: Oct. 3, 2019

(65) Prior Publication Data
US 2021/0036657 A1   Feb. 4, 2021

(30) Foreign Application Priority Data
Mar. 26, 2018  (JP) .............................. JP2018-058544

(51) Int. Cl.
*H03B 5/04*   (2006.01)
*H03B 5/32*   (2006.01)
(Continued)

(52) U.S. Cl.
CPC ................. *H03B 5/04* (2013.01); *H03B 5/32* (2013.01); *H03C 1/62* (2013.01); *H03L 1/026* (2013.01);
(Continued)

(58) Field of Classification Search
CPC . H04W 56/00; H03C 1/62; H03L 7/14; H03L 7/095; H03L 7/099; H03L 1/026; H03L 1/028; H03B 5/32; H03B 5/04
(Continued)

(56) References Cited

U.S. PATENT DOCUMENTS 5,881,374 A     3/1999  Osterberg
8,736,394 B2 *  5/2014  Kowada ................. H03L 7/146
                                                    331/176
(Continued)

FOREIGN PATENT DOCUMENTS

JP    2004516740    6/2004
JP    2012195932    10/2012
(Continued)

OTHER PUBLICATIONS

"International Search Report (Form PCT/ISA/210) of PCT/JP2019/012521," dated Jun. 11, 2019, with English translation thereof, pp. 1-4.

*Primary Examiner* — Arnold M Kinkead
(74) *Attorney, Agent, or Firm* — JCIPRNET

(57) ABSTRACT

In an oscillator device that outputs a frequency signal based on an oscillation frequency of a crystal resonator and a frequency setting value, a frequency difference detector that obtains a difference value corresponding to a frequency difference between the output frequency of the oscillator device and an external clock signal and a temperature detector are disposed. An aging coefficient and a temperature characteristic coefficient are obtained based on a secular change of the difference value obtained in the frequency difference detector and a secular change of the detected temperature during a period where the external clock signal is obtained. Furthermore, a frequency correction value is calculated using the aging coefficient and the temperature (Continued)

characteristic coefficient during a holdover period, and the frequency correction value is added to the frequency setting value.

9 Claims, 6 Drawing Sheets

(51) Int. Cl.
  *H03L 7/099* (2006.01)
  *H03L 1/02* (2006.01)
  *H04W 56/00* (2009.01)
  *H03C 1/62* (2006.01)

(52) U.S. Cl.
  CPC .............. *H03L 1/028* (2013.01); *H03L 7/099* (2013.01); *H04W 56/00* (2013.01)

(58) Field of Classification Search
  USPC .................. 331/18, 23, 2, 46, 175, 158, 176; 455/115.1, 183.1, 182.2; 375/376
  See application file for complete search history.

(56) References Cited

U.S. PATENT DOCUMENTS

2002/0158693 A1* 10/2002 Soong ..................... H03L 1/027
  331/18
2017/0194971 A1* 7/2017 Yonezawa ............... H03L 1/026

FOREIGN PATENT DOCUMENTS

| JP | 2016046582 | 4/2016 |
| JP | 2017005594 | 1/2017 |
| JP | 2017123629 | 7/2017 |
| JP | 2017153024 | 8/2017 |

* cited by examiner

OSCILLATOR DEVICE

CROSS-REFERENCE TO RELATED APPLICATION

This application is a 371 application of the international PCT application serial no. PCT/JP2019/012521, filed on Mar. 25, 2019, which claims the priority benefits of Japan application no. 2018-058544, filed on Mar. 26, 2018. The entirety of each of the above-mentioned patent applications is hereby incorporated by reference herein and made a part of this specification.

TECHNICAL FIELD

The present invention relates to an oscillator device that uses a crystal resonator.

BACKGROUND ART

A high frequency stability is required in, for example, base stations for a mobile communication of mobile phones, a terrestrial broadcasting system, and the like. In this respect, as a technique to generate a frequency signal further high in stability, for example, Patent Document 1 discloses an oscillator device (an oscillation clock circuit) that obtains and uses an external clock signal (a synchronization signal) high in frequency stability from a Global Positioning System (GPS) for calibrating a frequency signal (a corrected frequency signal after multiplication) generated using a crystal controlled oscillator (terms used in Patent Document 1 are written in the parentheses).

In such an oscillator device that achieves the frequency stability using the external clock signal may fail to receive the external clock signal (holdover), for example, when a malfunction occurs in equipment or a transmission path. Once the holdover thus happens, the external clock signal can be no longer used, and therefore, a problem is caused in generating a highly stable frequency signal.

Therefore, the oscillator device described in Patent Document 1 focuses on a temperature change and a secular change that may be a cause that influences on the stability of the frequency signal. During a period of holdover, the oscillator device obtains a stable frequency signal by compensating the influence of the temperature change and the secular change using a calibration signal obtained by calculating an age of the crystal controlled oscillator and an ambient temperature as parameters, instead of the external clock signal.

Patent Document 2 discloses an Oven Controlled Crystal Oscillator (OCXO) that obtains an oscillation frequency that corresponds to a frequency setting value by oscillating a crystal resonator in a heat regulated atmosphere. This OCXO obtains a further stable oscillation frequency by calculating a frequency correction value for cancelling a secular change in the oscillation frequency based on a correspondence relationship between an accumulated elapsed time of the oscillation after the oscillation of the crystal resonator has started and the oscillation frequency and correcting the frequency setting value.

Furthermore, Patent Document 3 discloses an oscillator device that oscillates a first oscillator circuit based on an external clock signal obtained from the GPS and obtains the frequency corresponding to the frequency setting value. Also, there is disposed a second oscillator circuit for obtaining a frequency corresponding to the frequency setting value, besides the first oscillator circuit. An approximation formula that predicts an influence of a secular change of the frequency is obtained based on time-series data of a difference value corresponding to a frequency difference between a frequency of the external clock signal when the external clock signal is received and a frequency obtained by the second oscillator circuit. Furthermore, there is disclosed a technique that uses the frequency of the second oscillator circuit obtained by correcting the frequency setting value with a correction value calculated from the approximation formula and an elapsed time as an internal clock signal when the external clock signal is interrupted to oscillate the first oscillator circuit.

Thus, while the technique to obtain the frequency signal with high stability even during the period of holdover is variously proposed, the request for the frequency stability during the period is increasing.

CITATION LIST

Patent Document

Patent Document 1: Japanese Unexamined Patent Application Publication (Translation of PCT Application) No. 2004-516740

Patent Document 2: Japanese Unexamined Patent Application Publication No. 2016-46582

Patent Document 3: Japanese Unexamined Patent Application Publication No. 2017-5594

SUMMARY OF THE INVENTION

Problems to be Solved

The present invention has been made under these circumstances, and provides a technique to obtain a frequency with further high stability even when an external clock signal is interrupted, in an oscillator device that uses a crystal resonator to stabilize a frequency based on the external clock signal.

Solutions to the Problems

An oscillator device of the invention includes an oscillating unit that includes a crystal resonator to output a frequency signal based on a frequency setting value. The oscillator device includes a frequency difference detector, a temperature detector, a correction value calculator, an addition unit, and a correction coefficient calculator. The frequency difference detector obtains a difference value corresponding to a frequency difference between an external clock signal obtained from outside and a frequency signal output from the oscillating unit. The temperature detector detects a temperature of an atmosphere where the crystal resonator is disposed. The correction value calculator calculates a frequency correction value to be added to the frequency setting value in order to equalize a frequency of the frequency signal to the frequency corresponding to the frequency setting value. The addition unit adds the frequency correction value obtained from the correction value calculator to the frequency setting value input to the oscillating unit. The correction coefficient calculator calculates an aging coefficient and a temperature characteristic coefficient based on a secular change of the difference value obtained in the frequency difference detector and a secular change of the detected temperature detected in the temperature detector. The aging coefficient indicates a changing rate of the frequency correction value per unit time. The temperature characteristic coefficient indicates a changing rate of the frequency correction value per unit temperature. The correction value calculator calculates the frequency correction value based on the difference value detected in the frequency difference detector during a period where the external clock signal is obtained, and calculates the frequency correction value using the aging coefficient and the temperature characteristic coefficient during a period where the external clock signal is interrupted.

Effects of the Invention

The present invention disposes the frequency difference detector that obtains the difference value corresponding to the frequency difference between the external clock signal input from outside and the frequency signal output from the oscillator unit and the temperature detector that detects the temperature of the atmosphere where the crystal resonator is disposed in the oscillator device that includes the oscillator unit that uses the crystal resonator to output the frequency signal based on the frequency setting value. The aging coefficient that indicates the changing rate of the frequency correction value per unit time and the temperature characteristic coefficient that indicates the changing rate of the frequency correction value per unit temperature are obtained based on the secular change of the difference value obtained in the frequency difference detector and the secular change of the detected temperature during the period where the external clock signal is obtained. Furthermore, the frequency correction value is obtained based on the aging coefficient and the temperature characteristic coefficient during the period where the external clock signal cannot be obtained, and the frequency correction value is added to the frequency setting value. Therefore, the frequency signal output by the oscillating unit can be stabilized even when the external clock signal cannot be received.

DESCRIPTION OF EMBODIMENTS

Outline of Embodiment

Figure 1:
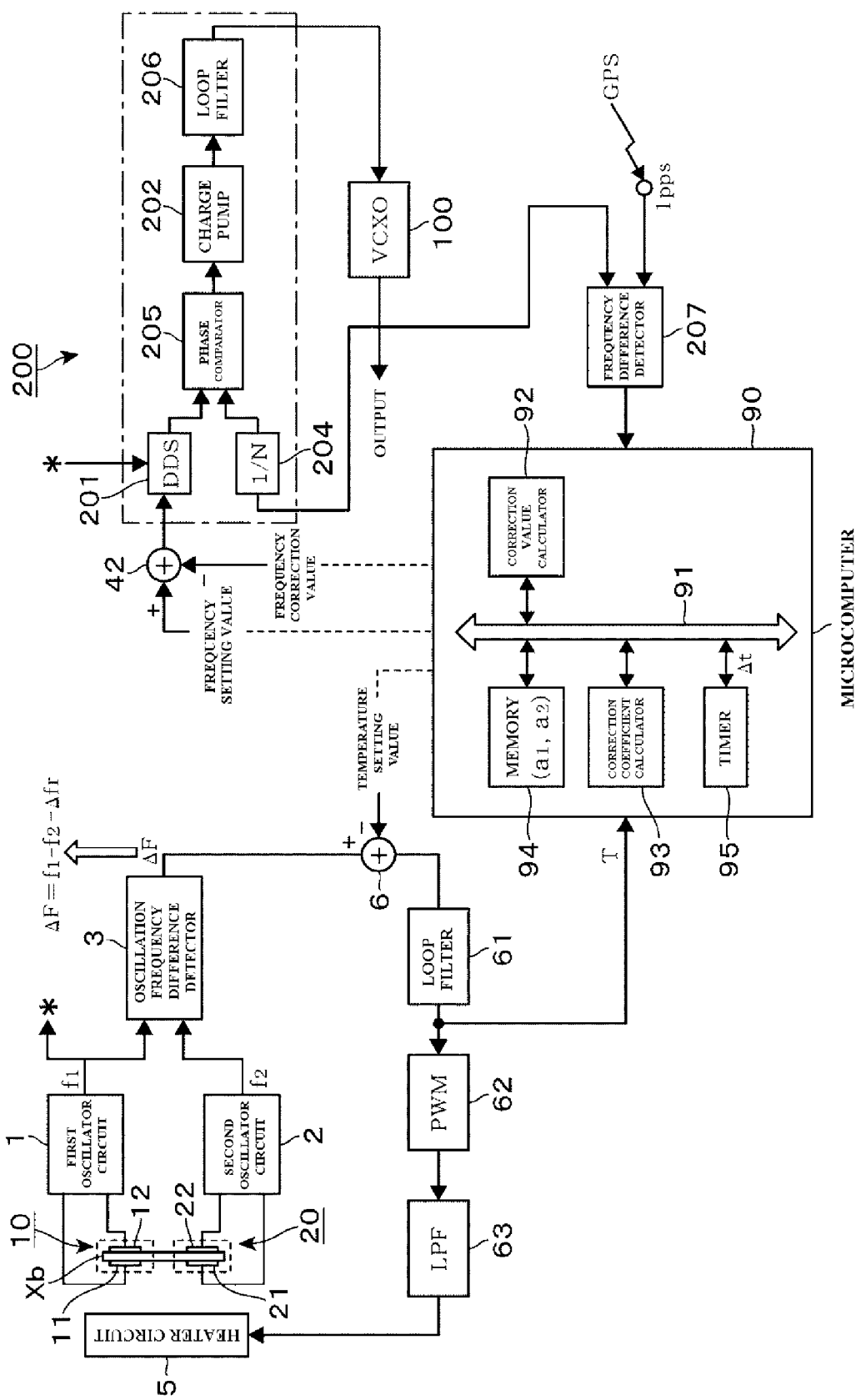
FIG. 1 is a block diagram illustrating an oscillator device according to an embodiment of the present invention.

The outline of this embodiment is briefly described before describing the embodiment of the present invention in details. FIG. 1 is a block diagram illustrating an overall configuration of the oscillator device according to the embodiment. A portion indicated by a reference numeral 200 in FIG. 1 is a PLL circuit unit having an oscillation function using a Phase Locked Loop (PLL). A reference numeral 201 is a Direct Digital Synthesizer (DDS) that outputs a frequency signal (reference signal) for reference used for the PLL.

For a reference clock for operating this DDS 201, an oscillation output of a first oscillator circuit 1 indicated by a reference numeral 1 in FIG. 1 is used. Accordingly, in order to resultantly improve frequency stability of a frequency signal output from a voltage control oscillator (VCXO: Voltage-Controlled crystal Oscillator) 100 as an oscillating unit, it is necessary to stabilize the reference clock.

Therefore, the oscillator device according to the embodiment detects a temperature of an atmosphere where a first crystal resonator 10 disposed in the first oscillator circuit 1 is placed, calculates a correction value using the detected temperature, and adds the correction value to a frequency setting value of the reference clock input to the DDS 201. With this, it is configured to stabilize a reference signal output from the DDS 201.

In this embodiment, a heater circuit (heater unit) 5 is disposed in order to achieve a constant temperature of the atmosphere where the first crystal resonator 10 is placed, and an output ΔF of an oscillation frequency difference detector 3, which is described later, corresponding to the detected temperature is used for controlling the heater circuit 5.

Furthermore, the oscillator device according to the embodiment has a function to obtain a signal (hereinafter also referred to as a GPS signal) of 1 pps (pulse per second) from the GPS as an external clock signal. During a period where the GPS signal is obtained, a frequency comparison between the GPS signal and a frequency signal output from the PLL circuit unit 200 is performed, and a frequency correction value is calculated based on a difference value corresponding to the frequency difference to be used for the correction of the frequency setting value input to the DDS 201. Thus, using the GPS signal high in frequency stability ensures further stabilizing the frequency (hereinafter also referred to as an output frequency) of the frequency signal output from the PLL circuit unit 200.

The oscillator device of the example learns a frequency change (aging) caused by an elapse of time from the start of using the first crystal resonator 10 and a frequency change caused by a temperature change of the atmosphere where the first crystal resonator 10 is disposed during the period where the GPS signal is obtained. The oscillator device obtains correction coefficients for compensating these respective frequency changes. Even during the period of holdover where GPS signal cannot be obtained, it is configured to calculate the frequency correction value based on the correction coefficients preliminarily learned and add the frequency correction value to the frequency setting value to stabilize the reference signal output by the DDS 201.

Overall Description of Embodiment

The following describes a detailed configuration of the oscillator device according to the embodiment. As illustrated in FIG. 1, the oscillator device includes the first crystal resonator 10 and a second crystal resonator 20. These first crystal resonator 10 and second crystal resonator 20 have, for example, a configuration where two divided regions are provided in a shared crystal element Xb in a strip shape and electrodes 11 and 12 (21 and 22) for excitation are disposed on both front and back surfaces of the respective divided regions (vibrating regions).

The first crystal resonator 10 and the second crystal resonator 20 are connected with the first oscillator circuit 1 and a second oscillator circuit 2, respectively. The oscillation outputs of these first and second oscillator circuits 1 and 2 are, for example, overtones (higher harmonics) of the first and second crystal resonators 10 and 20. This example is to use a signal corresponding to a difference between frequencies of both the oscillation outputs as a temperature detection signal, and the first crystal resonator 10 and the second crystal resonator 20 can be a part of a temperature detector. This temperature detector is used for controlling a supplied electricity of the heater circuit 5 included in the oscillator device as described below and for calculating the frequency correction value during the period of holdover. As described above, the oscillation output from the first oscillator circuit 1 is used as the reference clock of the DDS 201.

The first oscillator circuit 1 and the second oscillator circuit 2 have a subsequent stage side where the oscillation frequency difference detector 3 is disposed. This oscillation frequency difference detector 3, schematically speaking, is a circuit unit for taking out a frequency difference detected value f2−f1−Δfr (=ΔF) as a difference between a difference between an oscillation frequency f1 of the first oscillator circuit 1 and an oscillation frequency f2 of the second oscillator circuit 2 and Δfr. Δfr is a difference between f1 (f1r) and f2 (f2r) at a reference temperature of, for example, 25° C.

Here, an exemplary difference between f1 and f2 includes, for example, a several MHz. In this example, the oscillation frequency difference detector 3 calculates a difference, ΔF, between a value corresponding to the difference between f1 and f2 (f2−f1) and a value corresponding to the difference between f1 and f2 at a reference temperature of, for example, 25° C. (f2r−f1r) to be established. In the case of this embodiment, the value obtained by the oscillation frequency difference detector 3 is {(f2−f1)/f1}−{(f2r−f1r)/f1r} to provide more details. However, an illustration of the output of the oscillation frequency difference detector 3 is omitted in the drawing.

The oscillation frequency difference detector 3 has a rear stage where an addition unit 6 is disposed. The addition unit 6 obtains a temperature setting value (target temperature) from a microcomputer 90 described below, and compute a difference between the temperature setting value and the frequency difference detected value ΔF. As illustrated in FIG. 1, the addition unit 6 has a rear stage where a loop filter 61 corresponding to an integration circuit unit is disposed. Furthermore, the loop filter 61 has a rear stage where a PWM wave interpolation unit 62 that converts a digital signal into a pulse signal of a certain period of time is disposed. The PWM wave interpolation unit 62 has a rear stage where a low-pass filter (LPF) 63 is disposed to average an output from the PWM wave interpolation unit 62 and input a DC voltage corresponding to the number of pulses as the output to the heater circuit 5. The digital signal corresponding to a detected temperature output from the loop filter 61 is configured to be input to the microcomputer 90 described below. A loop from the oscillation frequency difference detector 3 to the LPF 63 configures a heater control unit in this example.

The PLL circuit unit 200 compares a phase of the reference signal output from the DDS 201 with a phase of the clock obtained by dividing the output of the VCXO 100 with a frequency divider 204 in a phase comparator 205, and a charge pump 202 converts a phase difference as the comparison result into an analog signal. The signal converted into the analog signal is input to a loop filter 206 to be controlled to stabilize the PLL. The DDS 201 is input with the oscillation output from the first oscillator circuit 1 as a reference clock. The DDS 201 is configured to be input with a frequency setting value after correction to which a frequency correction value is added in an addition unit 42 as described later.

The oscillator device according to the embodiment includes a frequency difference detector 207 that detects a frequency difference between, for example, a GPS signal of 1 pps as an external clock signal and an output frequency output from the VCXO 100. The frequency difference detector 207 is configured to, for example, divide the frequency signal output from the VCXO 100, and output a frequency difference between the frequency signal after being divided and the GPS signal as a difference value to the microcomputer 90. For example, when the frequency setting value is 10 MHz, the frequency signal from the VCXO 100 is divided into 1/100,000, and the frequency difference with the GPS signal (1 pps) is detected. Note that, as long as a sufficient resolution can be obtained, the frequency difference detector 207 may detect the frequency difference by multiplying the GPS signal to, for example, 10 MHz, instead of dividing the frequency signal.

The microcomputer 90 includes a correction value calculator 92, a correction coefficient calculator 93, a memory 94, and a timer 95 as illustrated in FIG. 1. A reference numeral 91 in FIG. 1 is a bus. While the oscillator device in the example calculates the frequency correction value based on the GPS signal obtained from the GPS to correct the frequency setting value, there sometimes occur a holdover where the GPS signal is interrupted as described above.

Meanwhile, the request to stabilize the output frequency even during the period of holdover is increasing. For example, as described above, even though the holdover continues for 24 hours when the output frequency is 10 MHz, it is requested to ensure achieving stability with a phase shift amount of approximately 1.5 μs or less. This corresponds to a changing rate of the output frequency with respect to the frequency setting value (in further detail, "frequency corresponding to frequency setting value") of 17.35 ppt/second or less.

Therefore, as described above, in the oscillator device in this example, the correction coefficient calculator 93 calculates correction coefficients for calculating a frequency correction value used during the period of holdover where the GPS signal is not obtained during a period where the GPS signal is obtained. At this time, a compensation of the frequency change in association with aging has conventionally been performed. However, in order to correct the frequency with extremely high accuracy of 1 ppt/second or less, it was found that it is necessary to calculate a frequency correction value that can compensate a frequency change in association with a slight temperature change caused by a delay of control, a fluctuation, and the like even in an atmosphere where a temperature control by the heater circuit 5 is performed.

In this aspect, the correction coefficient calculator 93 in this example has a function to obtain an aging coefficient (a1) for compensating a change of the frequency correction value by aging of the first crystal resonator 10 and a temperature characteristic coefficient (a2) for compensating a change of the frequency correction value by a temperature change of the first crystal resonator 10. These aging coefficient (a1) and temperature characteristic coefficient (a2) calculated by the correction coefficient calculator 93 are stored in the memory 94.

The correction value calculator 92 calculates a frequency correction value based on a difference value output from the frequency difference detector 207 during the period where the GPS signal is obtained. The correction value calculator 92 calculates a frequency correction value from the aging coefficient (a1) and the temperature characteristic coefficient (a2) stored within the memory 94, a detected temperature T obtained from the loop filter 61 and an elapsed time T measured with the timer 95 during the period of holdover where the GPS signal is not obtained.

The microcomputer 90 outputs the temperature setting value to the addition unit 6.

Subsequently, an effect of the oscillator device having the configuration described above will be given. First, an operation during the period where the GPS signal is obtained will be described. As soon as the power of the oscillator device is turned on to activate the oscillator device, the first crystal resonator 10 and the second crystal resonator 20 oscillate, and the respective oscillation outputs are obtained. A frequency setting value is output from the microcomputer 90, the DDS 201 operates based on an oscillation output (reference clock) from the first oscillator circuit 1 and the frequency setting value, and a reference signal is output from the DDS 201. Based on a result of phase comparison between the reference signal from the DDS 201 and the frequency signal from the VCXO 100, a frequency of the VCXO 100 is controlled.

Here, the oscillator device in the example compares frequencies between a frequency signal (a frequency division signal obtained by dividing the frequency signal in practice) output from the PLL circuit unit 200 and the GPS signal of 1 pps in the frequency difference detector 207. At this time, regardless of the performance of the frequency control by the PLL circuit unit 200, when a frequency difference is detected, there is a possibility of the reference signal compared with the frequency signal being displaced from a frequency corresponding to the frequency setting value. The reasons of the occurrence of such an event include progressed aging in the first crystal resonator 10 used for outputting the reference clock and an influence of a change in the oscillation frequency caused by a delay in temperature control by the heater circuit 5 and the like.

Meanwhile, during the period where the GPS signal is obtained, a frequency difference with (the frequency division signal of) the frequency signal from the PLL circuit unit 200 can be identified using the extremely stable GPS signal of 1 pps. Therefore, an actual frequency of the frequency signal output from the PLL circuit unit 200 is obtained based on this frequency difference (difference value), and, from a displaced amount between the actual frequency and a frequency corresponding to the frequency setting value, the frequency setting value is corrected so as to cancel the displaced amount. This ensures obtaining a stable frequency signal regardless of the influence of the aging and the temperature change in a side of the first crystal resonator 10.

The correction value calculator 92 calculates the frequency correction value based on the above-described concept and outputs the frequency correction value to the addition unit 42. The addition unit 42 adds the frequency correction value to the frequency setting value and outputs the resultant to the DDS 201. As the result, the influence of the frequency displacement on a side of the reference clock is cancelled to ensure outputting a frequency signal of a correct frequency corresponding to the frequency setting value.

Compared with the above-described operation, during the period of holdover where the GPS signal cannot be obtained, a frequency correction value with high accuracy cannot be calculated unless accurately obtaining causes of the occurrence of the frequency displacement in the reference clock side and a degree of influence of each cause. Therefore, the oscillator device in this example executes a learning operation that preliminarily obtain the correction coefficients (the aging coefficient (a1) and the temperature characteristic coefficient (a2)) for calculating the frequency correction value for the period of holdover, during the period where the GPS signal is obtained.

The correction value calculator in this example calculates the frequency correction value using a linear expression (linear sum) expressed in, for example, Formula (1) below.

$$\Delta h = (a1) \times (\Delta \tau) + (a2) \times (\Delta T) \qquad (1)$$

However, $\Delta h$ is the amount of change of the frequency correction value, a1 is the aging coefficient (the changing rate of the frequency correction value per unit time), $\Delta \tau$ is the elapsed time, a2 is the temperature characteristic coefficient (the changing rate of the frequency correction value per unit temperature), and $\Delta T$ is the amount of change of the detected temperature (the amount of temperature change).

The correction coefficient calculator 93 in this example learns the aging coefficient (a1) during a period of aging measurement where an influence of temperature change is low. Furthermore, the correction coefficient calculator 93 learns the temperature characteristic coefficient using the aging coefficient learnt during the period of aging measurement using a period where a temperature change has occurred as a period of temperature characteristic measurement.

Figure 2:
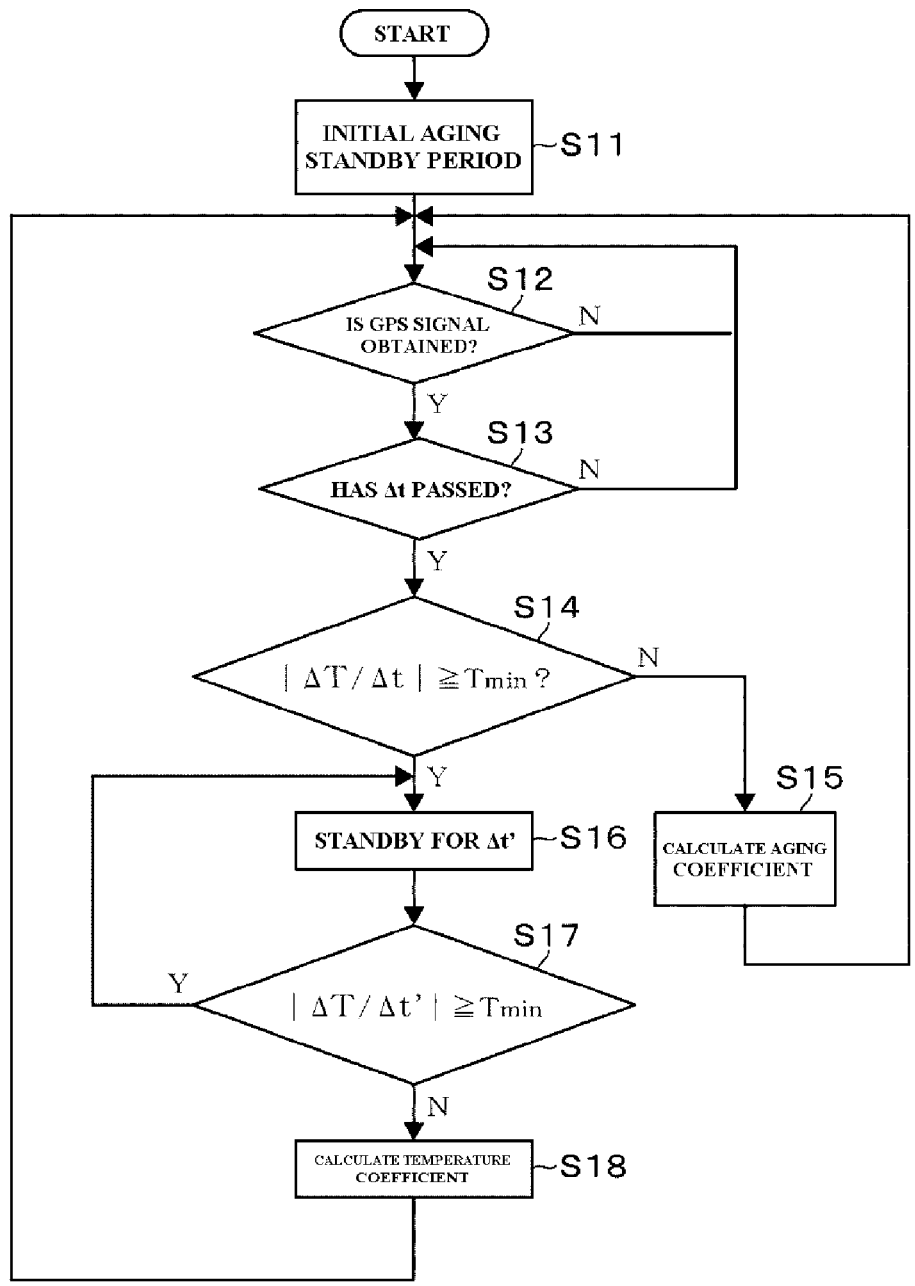
FIG. 2 is a flowchart illustrating a learning operation for calculating correction coefficients.

The following describes the learning operation following a flowchart in FIG. 2. First, when the oscillator device is activated, and the oscillator device stands by without learning the correction coefficients for, for example, six hours for initial aging (Step S11). As shown in Formula (1), the correction value calculator 92 uses the linear expression of the correction coefficients (the aging coefficient and the temperature characteristic coefficient) and each of variables (the elapsed time and the amount of temperature change) upon calculating the frequency correction value. Meanwhile, immediately after the power of the oscillator device is turned on, a relationship between the elapsed time by aging of the first crystal resonator 10 and the frequency correction value does not fall into the relationship shown in the linear expression in some cases. Therefore, after the power is turned on, the oscillator device stands by for approximately six hours (an initial aging standby period).

After the oscillator device stands by for a predetermined time, an amount of change of the frequency correction value corresponding to the elapsed time shows a correlation roughly approximated by the linear expression.

Next, it is determined whether the GPS signal is obtained or not (Step S12). When the GPS signal is not obtained at this time, the oscillator device stands by until the GPS signal can be obtained (Step S12; NO).

Next, when the GPS signal can be obtained (Step S12; YES), it is determined whether a predetermined aging measurement period $\Delta t$ has passed or not (Step S13). When the aging measurement period $\Delta t$ has not passed (Step S13; NO), the oscillator device stands by while confirming that it is in a state where the GPS signal is being obtained (Step S12; YES→S13; NO).

Figure 3:
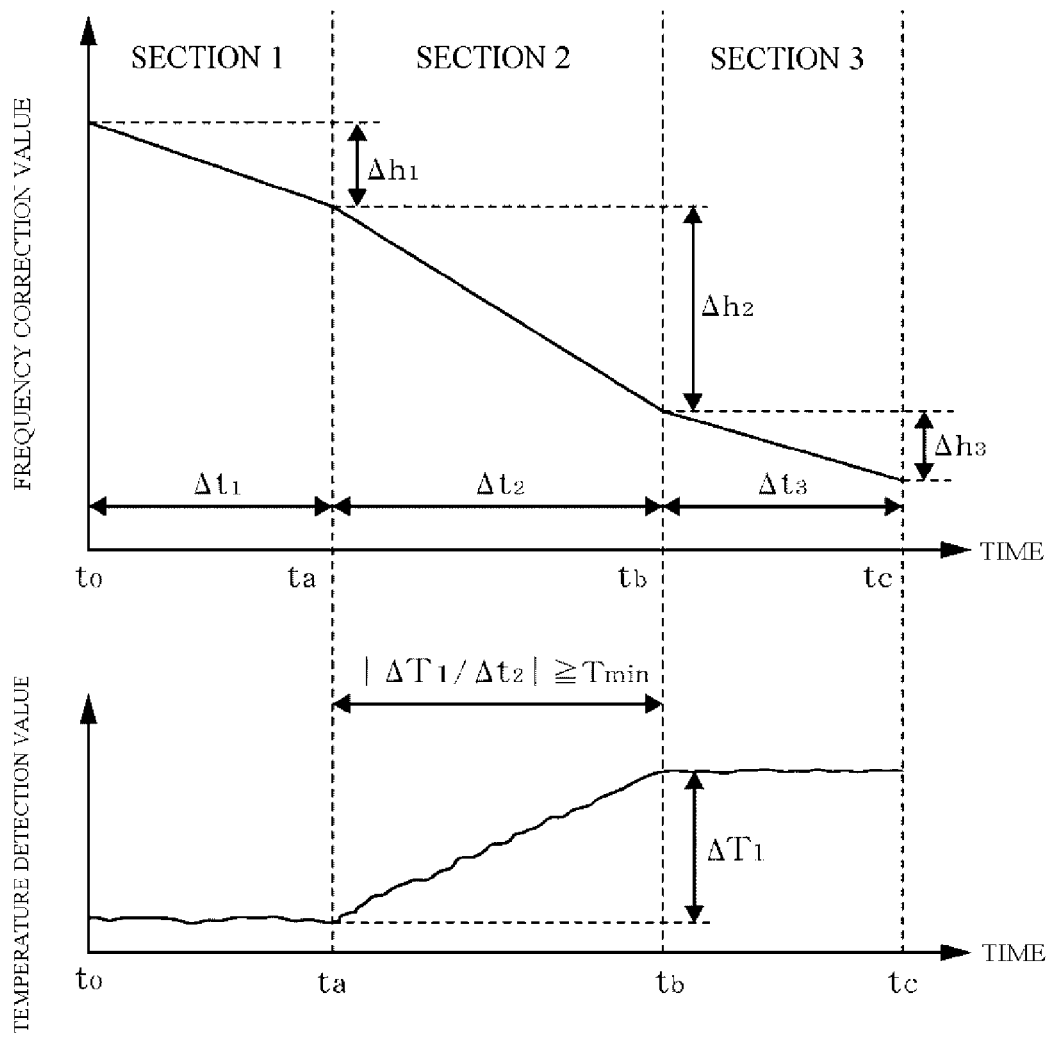
FIG. 3 is a timing chart relating to an operation when the correction coefficients are calculated.

Here, a description of after Step S13 will be given also with reference to FIG. 3. FIG. 3 is a timing chart illustrating temporal changes of the frequency correction value and the detected temperature since the GPS signal was obtained. Time t0 in FIG. 3 indicates a starting time of Step S13.

When the aging measurement period $\Delta t$ (described as $\Delta t1$ in FIG. 3) has passed as illustrated in FIG. 3 (Step S13; YES), the changing rate of the detected temperature per unit time ($|\Delta T/\Delta t|$) is obtained during the period (the aging measurement period $\Delta t$), and it is determined whether it exceeds the minimum temperature change rate Tmin as a threshold value or not (Step S14).

The minimum temperature change rate Tmin is a temperature change rate per unit time that can be determined that the change in the detected temperature is approximately negligible, and is stored, for example, in the memory 94. As an example, the minimum temperature change rate Tmin can be set to a value, for example, equal to or less than 0.1° C./hour. When the changing rate of the detected temperature per unit time does not exceed the minimum temperature change rate Tmin (|ΔT/Δt|<Tmin) (Step S14; NO), the aging coefficient is calculated (Step S15).

The aging coefficient (a1) is calculated by, for example, using the frequency correction value Δh1 during the period of the period Δt1 from Time t0 to Time ta as illustrated in FIG. 3. In Section 1 from Time t0 to Time ta, it is determined that the change in the detected temperature is approximately negligible (the aging measurement period). In view of this, even when the oscillation frequency of the first crystal resonator 10 has changed, it can be determined that the change of the oscillation frequency is caused by aging. Therefore, the change Δh1 of the frequency correction value during the period of Section 1 can be said to be caused by aging of the first crystal resonator 10.

As shown in Formula (1), the frequency correction value of the first crystal resonator 10 by aging is approximated by the linear expression using the amounts of changes of the elapsed time and the detected temperature as the variables in this example. As described above, during the aging measurement period, the change in the detected temperature is negligible. Therefore, assigning the amount of change Δh1 of the frequency correction value and the elapsed time Δt1 to Formula (1) and transforming it with the second term on the right side set to zero ensures calculating the aging coefficient (a1) indicating the changing rate of the frequency correction value per unit time with the following Formula (2).

$$a1=\Delta h1/\Delta t1 \qquad (2)$$

The correction coefficient calculator 93 executes the above-described calculation and updates the aging coefficient (a1) stored, for example, in the memory 94 (Step S15). The GPS signal is then obtained, and the above-described operation is repeated as long as the changing rate of the detected temperature does not exceed the minimum temperature change rate (|ΔT/Δt|<Tmin) (Step S12; YES→S13; YES→S14; NO→S15).

When it is determined that the changing rate of the detected temperature is equal to or more than the minimum temperature change rate (|ΔT/Δt|≥Tmin), it is regarded as the start of the temperature characteristic measurement period, and the learning of the temperature characteristic coefficient is executed (Step S14; YES). For example, in Section 2 from Time to to Time tb in FIG. 3, a change in the detected temperature is generated to provide |ΔT1/Δt1|≥Tmin, thus corresponding to the temperature characteristic measurement period.

Meanwhile, since the temperature change in the atmosphere where the first crystal resonator 10 is placed in some cases depends on a temperature change in the external environment, it is sometimes not possible to predict when the temperature characteristic measurement period is terminated. In this case, for example, after the oscillator device stands by for a predetermined measurement standby time Δt' (Step S16), a changing rate of the detected temperature per unit time during the measurement standby time Δt' (|ΔT/Δt'|) is obtained, and it is determined whether it exceeds the minimum temperature change rate Tmin or not (Step S17).

When it is equal to or more than the minimum temperature change rate Tmin (|ΔT/Δt'|≥Tmin) (Step S17; YES), the temperature change in the atmosphere where the first crystal resonator 10 is placed is continuing and the temperature characteristic measurement period is continuing, and therefore the oscillator device stands by without doing anything else (Step S17; YES→S16).

Assume that, for example, the time passes from Time ta to the time Δt2, and the detected temperature becomes constant at Time tb as illustrated in FIG. 3 eventually. In this case, the minimum temperature change rate falls below Tmin, and the temperature characteristic measurement period is terminated (Step S17; NO). Thereafter, the temperature characteristic coefficient (a2) is calculated using the amount of change Δh2 of the frequency correction value obtained during the temperature characteristic measurement period of Section 2 (Step S18).

Note that, under the environment where rise and drop of the temperature of the atmosphere where the first crystal resonator 10 is placed continuously occur, it is preferred to calculate the temperature characteristic coefficients at respective timings in a temperature rise process and a temperature drop process by determining positive/negative of the amount of temperature change (ΔT) in addition to the determination according to the changing rate of the detected temperature described above.

As described above, the oscillator device in this example stabilizes the oscillation frequency of the first oscillator circuit by temperature control with the heater circuit 5 heating the atmosphere where the first crystal resonator 10 is placed. nevertheless, there is a case where the temperature of the atmosphere where the first crystal resonator 10 is placed changes due to, for example, a delay of the temperature control in a case where, for example, a sudden temperature change of the ambient temperature occurs. As a result, there is a case where, when the oscillation frequency (the reference clock of the DDS 201) of the first oscillator circuit 1 changes, a frequency difference is generated between the divided frequency signal of the output frequency and the GPS signal of 1 pps and the change of the frequency correction value is generated. It can be understood that the amount of change of the frequency correction value caused by aging of the first crystal resonator 10 (an aging factor frequency correction amount) and the amount of change of the frequency correction value caused by the temperature change (a temperature change factor frequency correction amount) are included in the amount of change of the frequency correction value in Section 2 (the temperature characteristic measurement period) illustrated in FIG. 3.

Here, there is a case where the value of the aging coefficient (a1) does not significantly change and is temporally stable during a relatively short period of, for example, a few hours or a few days. When the period of Section 1 to 2 illustrated in FIG. 3 corresponds to the period where such an aging coefficient is temporally stable, the aging factor frequency correction amount during the period of Section 2 can be estimated using the aging coefficient calculated in Section 1. Therefore, subtracting the aging factor frequency correction amount during the period from the amount of change Δh2 of the frequency correction value in Section 2 ensures obtaining the temperature change factor frequency correction amount between Time to and Time tb.

Specifically, the aging factor frequency correction amount in Section 2 can be obtained by multiplying the aging coefficient (a1) updated in Section 1 stored in the memory 94 by the period Δt2 of Section 2. Furthermore, the temperature change factor frequency correction amount in Section 2 becomes a value obtained by subtracting the aging factor frequency correction amount (Δt2)×(a1) from the frequency correction amount Δh2 during the period by using the relationship of Formula (1). Assigning these values to Formula (1) and transforming it obtains the temperature characteristic coefficient (a2) with the following Formula (3).

$$a2=\{\Delta h2-(\Delta t2)\times(a1)\}/\Delta T \quad (3)$$

The correction coefficient calculator 93 executes the above-described calculation and updates the temperature characteristic coefficient (a2) stored in the memory 94.

Thereafter, Section 3 from Time tb to Time tc illustrated in FIG. 3 is determined to be the aging measurement period because the detected temperature is approximately constant, and an operation to calculate the above-described aging coefficient is executed (Step S12 to S15).

Based on the operation described above, the aging coefficient and the temperature characteristic coefficient used during the period of holdover are calculated using the frequency correction value obtained based on the result compared with the GPS signal.

Figure 4:
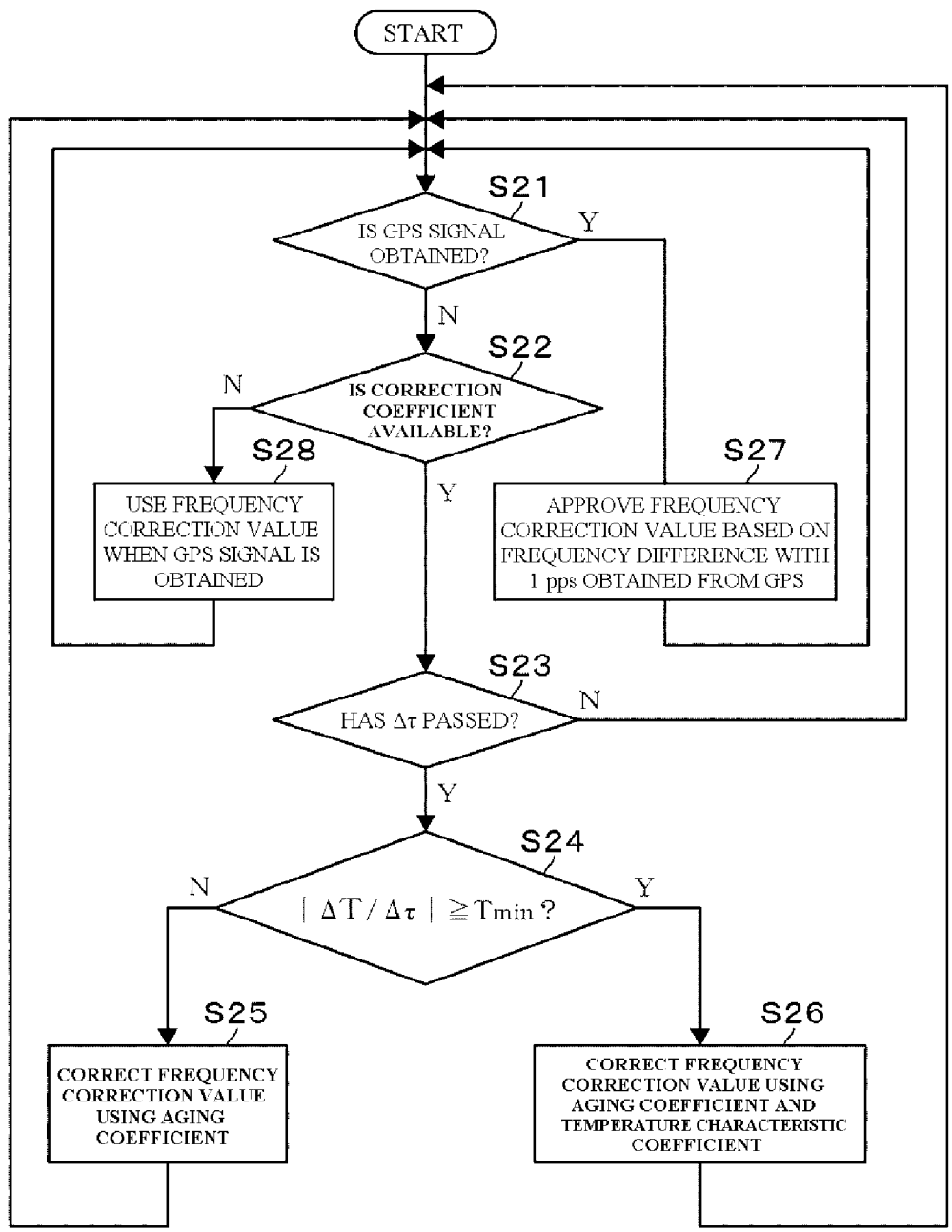
FIG. 4 is a flowchart illustrating a flow of an operation to correct a frequency setting value.

Next, an output operation of the frequency signal from the oscillator device including the use of these aging coefficient and temperature characteristic coefficient will be described with reference to a flowchart in FIG. 4 and a timing chart in FIG. 5.

After the activation (start) of the oscillator device, the frequency correction value is calculated based on the frequency difference (difference value) obtained from the frequency signal output from the PLL circuit unit 200 and the GPS signal of 1 pps during the period where the GPS signal can be obtained (Step S21; YES), and the frequency correction value is added to the frequency setting value (Step S27).

Meanwhile, in the period of the holdover where the GPS signal cannot be obtained (Step S21; NO), it is confirmed whether each of the correction coefficients (the aging coefficient and the temperature characteristic coefficient) calculated during the period of obtaining the GPS signal is usable or not (Step S22). For criteria for the determination of usable or not, for example, whether the correction coefficients are stored in the memory 94 or not is determined. When an average value of the calculated correction coefficients is used for multiple times as described later, for example, whether the number of the correction coefficients used for the calculation of the average value has reached the number set in advance or not is determined.

When it is determined that the aging coefficient and the temperature characteristic coefficient are not usable (Step S22; NO), for example, the frequency setting value is corrected using the frequency correction value obtained immediately before the period where the GPS signal cannot be obtained (Step S28), and the process returns to confirmation of obtainment of the GPS signal (Step S21).

Meanwhile, when the aging coefficient and the temperature characteristic coefficient are usable (Step S22; YES), confirmation of obtainment of the GPS signal and confirmation of availability of the correction coefficients are performed until a predetermined correction value adjustment period (that is, the elapsed time) Δτ passes (Step S23; NO→S21; NO→S22; YES). After the correction value adjustment period (the elapsed time) ΔT passes, it is determined whether the changing rate of the detected temperature (|ΔT/Δτ|) per unit time exceeds the minimum temperature change rate Tmin or not based on the amount of change ΔT of the detected temperature during the correction value adjustment period (the elapsed time) Δτ (Step S24).

Figure 5:
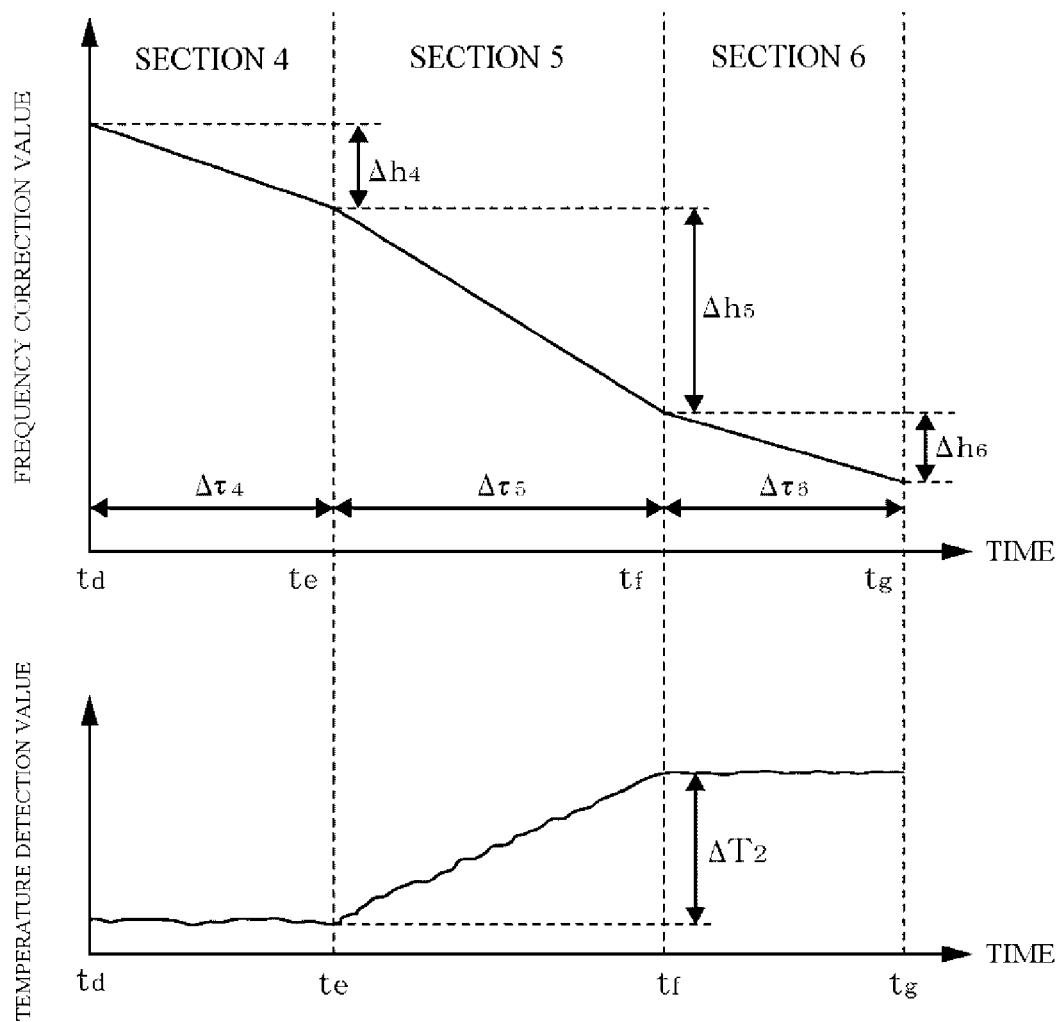
FIG. 5 is a timing chart relating to an operation to correct the frequency setting value during a period where a GPS signal is interrupted.

For example, Section 4 from Time td to Time tf illustrated in FIG. 5 has "|ΔT/Δτ|<Tmin," and the change of the detected temperature is small and ΔT can be regarded as zero. Note that the correction value adjustment period Δτ may be set to a period shorter than the above-described aging measurement period and temperature characteristic measurement period Δt to repeat the calculation of the frequency correction value and the setting operation little by little. However, in order to easily obtain the concept of the frequency correction value calculation, correction value adjustment periods (the elapsed times) Δτ4 to Δτ6 illustrated in FIG. 5 are illustrated with intervals similar to the aging measurement period and the temperature coefficient characteristic measurement period Δt1 to Δt3 described using FIG. 3.

When the change in temperature is thus small (Step S24; NO), the correction value adjustment period (the elapsed time) Δτ4 is assigned only to the first term of the above-described Formula (1) obtained using the aging coefficient (a1) and the temperature characteristic coefficient (a2) read out of the memory 94 to calculate the frequency correction value. This calculates the frequency correction value (Δh4 in FIG. 5) that only uses the aging coefficient, and the frequency correction value is used for the correction of the frequency setting value (Step S25).

Meanwhile, when the ambient temperature of the first crystal resonator 10 changes as in Section 5 from Time te to Time tf illustrated in FIG. 5, it is determined that the changing rate of the detected temperature per unit time is the minimum temperature change rate or more (|ΔT2/Δτ5|≥Tmin) (Step S24; YES). In this case, both the correction value adjustment period (the elapsed time) NO and the amount of temperature change ΔT2 are assigned to Formula (1) obtained using the aging coefficient (a1) and the temperature characteristic coefficient (a2) read out of the memory 94 to calculate the frequency correction value.

In view of this, the frequency correction value (Δh5 in FIG. 5) using both the aging coefficient and the temperature characteristic coefficient is calculated and transmitted to the addition unit 42, and used for the correction of the frequency setting value (Step S26).

Furthermore, in Section 6 from Time tf to Time tg illustrated in FIG. 5, the amount of temperature change ΔT is regarded as zero because the temperature is constant, and the frequency correction value Δh6 is calculated from the correction value adjustment period (the elapsed time) Δτ6 of Section 6 and the aging coefficient (a1).

According to the above-described embodiment, in the oscillator device that uses the oscillation frequency of the first crystal resonator 10 as the reference clock to output the frequency signal based on the frequency setting value, the frequency difference detector 207 that obtains the difference value corresponding to the frequency difference between (the frequency division signal of) the output frequency of the oscillator device and the GPS signal of 1 pps is disposed. Furthermore, it is configured to detect the temperature of the atmosphere where the first crystal resonator 10 is placed. During the period where the GPS signal is obtained, the aging coefficient (a1) for calculating the correction value to correct the frequency variation by aging of the first crystal resonator 10 and the temperature characteristic coefficient (a2) for calculating the correction value to correct the frequency variation by temperature change of the first crystal resonator 10 are obtained. During the period of holdover, the frequency correction value is calculated using the aging coefficient and the temperature characteristic coefficient, and the frequency correction value is added to the frequency setting value. Therefore, the output frequency can be stabilized even during the period of holdover where the GPS signal cannot be obtained.

Here, for the learning of the aging coefficient and the temperature characteristic coefficient described using FIG. 2, in the calculation steps (Steps S15 and S18) of the correction coefficients (the aging coefficient and the temperature characteristic coefficient), the correction coefficient (a2) repeatedly calculated in the past may be stored for respective latest multiple times. The frequency correction value may be calculated using an average value of a plurality of the correction coefficients including newly calculated correction coefficients and the correction coefficients calculated in the past. The frequency correction value can be calculated using the average value of the aging coefficients and the temperature characteristic coefficients calculated for multiple times, thereby ensuring improved correction accuracy of the output frequency.

The present invention is not limited to the embodiment described using FIGS. 1 to 5, and is applicable to any oscillator device as long as it can obtain an oscillation output based on a frequency setting value using a crystal resonator.

Figure 6:
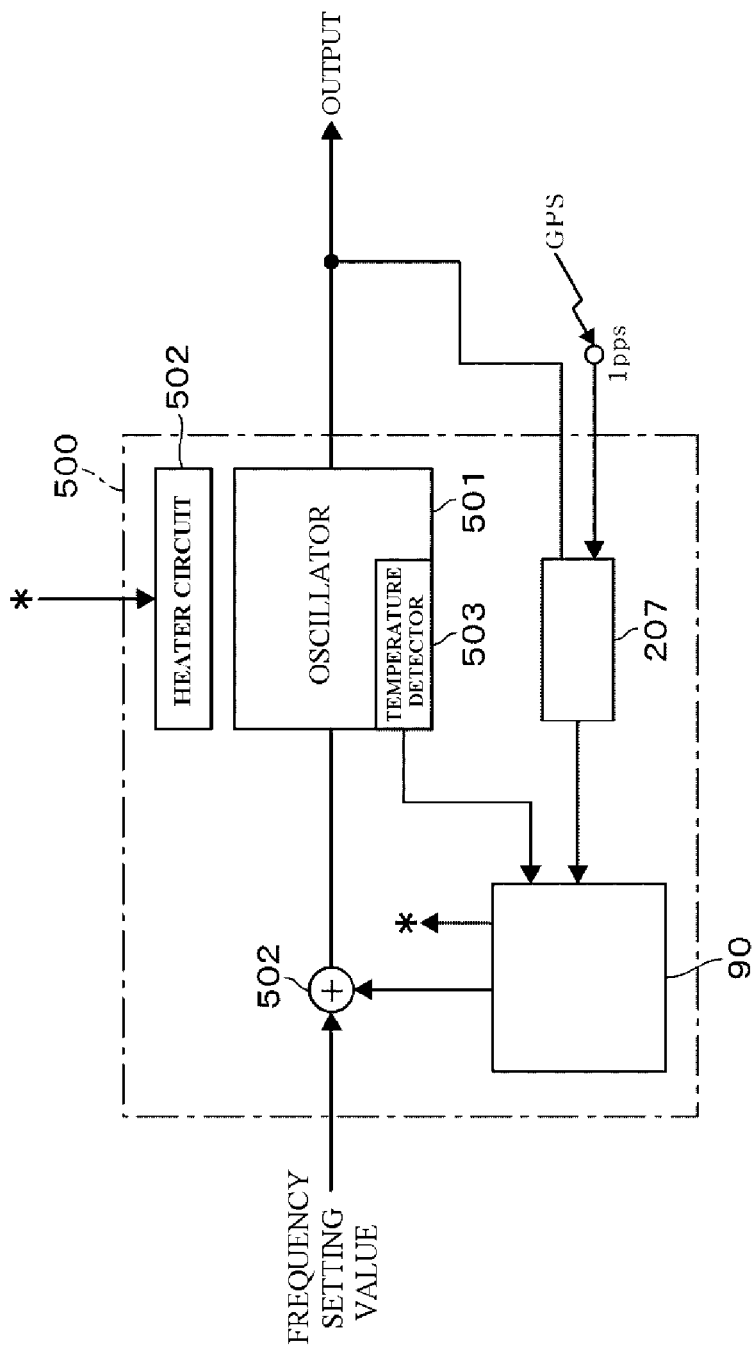
FIG. 6 is a block diagram illustrating an example of an oscillator device according to another embodiment.

FIG. 6 illustrates an exemplary oscillator device 500 according to another embodiment. The oscillator device 500 in this example uses an oscillator (oscillating unit) 501 including a crystal resonator (not illustrated) to output the frequency signal corresponding to an input frequency setting value. In the oscillator 501, a heater circuit (heater unit) 502 heats an atmosphere where the crystal resonator is placed to a constant temperature. Therefore, the oscillator device 500 including this oscillator 501 is an OCXO.

One example of the oscillator 501 can be one that includes an oscillator circuit made of, for example, a Colpitts circuit and to which a control voltage of the Colpitts circuit is input via a variable capacitance diode. In this case, the control voltage corresponds to the frequency setting value, and the output frequency of the oscillator 501 is adjusted corresponding to the control voltage. The oscillator device 500 includes the microcomputer 90 having functions of the above-described correction value calculator and correction coefficient calculator, and the frequency difference detector 207.

For example, the frequency difference detector 207 obtains a frequency difference (a difference value) between a frequency signal (a frequency division signal) output from the oscillator 501 and a GPS signal of 1 pps, and input the frequency difference to the microcomputer 90. The oscillator 501 includes a temperature detector 503, and a detected temperature obtained in the temperature detector 503 is input in the microcomputer 90. The microcomputer 90 adjusts an output of the heater circuit 502 based on the detected temperature to make the temperature of the oscillator constant. Even in the oscillator device 500 having such a configuration, executing the learning operation of the correction coefficients (the aging coefficient and the temperature characteristic coefficient) described using FIG. 2, the calculation of the frequency correction value described using FIG. 4, and the setting operation ensures outputting the stable frequency signal.

For obtaining the temperature characteristic coefficient (a2), the present invention may be configured to be able to vary the temperature of the atmosphere where the crystal resonator (illustrated) is placed with a temperature control mechanism, such as the above-described heater unit (the heater circuit 502 in FIGS. 1 and 6). For obtaining the temperature characteristic coefficient (a2), there also is a possibility of deteriorated accuracy of the obtained temperature characteristic coefficient when the temperature change of the crystal resonator is small. Furthermore, in an oscillator device high in resolution of the frequency change with respect to the temperature change, the frequency signal may appear to be fluctuated for a slight temperature change, and therefore, there is a possibility of deteriorated accuracy of the calculated temperature characteristic coefficient. Therefore, the accuracy of the temperature characteristic coefficient may be increased by obtaining the temperature characteristic coefficient by providing a temperature change of equal to or more than a certain temperature difference, such as 1° C. or more to the crystal resonator using, for example, the above-mentioned temperature control mechanism.

When the temperature characteristic coefficient (a2) is obtained by providing a forced temperature change, for example, in the oscillator device illustrated in FIG. 1, the temperature setting value for calculating the temperature characteristic coefficient (a2) for changing the temperature of the atmosphere where the first crystal resonator 10 is disposed by 1° C. or more is output from the microcomputer 90. Then, a case where, the operations of Steps S14, and S16 to S18 in FIG. 2 are executed during the period where the temperature is changing can be exemplarily illustrated.

While in the above-described example, the linear expression using the aging coefficient (a1) and the temperature characteristic coefficient (a2) is employed in calculating the frequency correction value during the period of holdover, the formula used when the frequency correction value is calculated is not limited to the linear expression. When further appropriate, the frequency correction value can be calculated based on a linear sum of a logarithmic function or an exponential function of the elapsed time ($\Delta \tau$) or the amount of temperature change ($\Delta T$) and the respective correction coefficients.

The invention claimed is:

1. An oscillator device comprising:
   an oscillating unit that includes a crystal resonator to output a frequency signal based on a frequency setting value;
   a frequency difference detector that obtains a difference value corresponding to a frequency difference between an external clock signal obtained from outside and a frequency signal output from the oscillating unit;
   a temperature detector that detects a temperature of an atmosphere where the crystal resonator is disposed;
   a correction value calculator that calculates a frequency correction value to be added to the frequency setting value in order to equalize a frequency of the frequency signal to the frequency corresponding to the frequency setting value;
   an addition unit that adds the frequency correction value obtained from the correction value calculator to the frequency setting value input to the oscillating unit; and
   a correction coefficient calculator that calculates an aging coefficient and a temperature characteristic coefficient based on a secular change of the difference value obtained in the frequency difference detector and a secular change of the detected temperature detected in the temperature detector, the aging coefficient indicating a changing rate of the frequency correction value per unit time, the temperature characteristic coefficient indicating a changing rate of the frequency correction value per unit temperature, wherein
   the correction value calculator calculates the frequency correction value based on the difference value detected in the frequency difference detector during a period where the external clock signal is obtained, and calculates the frequency correction value using the aging coefficient and the temperature characteristic coefficient during a period where the external clock signal is interrupted.

2. The oscillator device according to claim 1, wherein the oscillating unit includes a PLL circuit unit including a voltage control oscillator and a DDS that outputs a frequency signal for reference for the PLL circuit unit corresponding to the frequency setting value by receiving the frequency setting value and a reference clock, and
the crystal resonator is disposed in an oscillator circuit that outputs the reference clock for the DDS.

3. The oscillator device according to claim 1, wherein the oscillating unit includes an oscillator circuit including the crystal resonator.

4. The oscillator device according to claim 1, further comprising:
a heater unit that heats the atmosphere where the crystal resonator is disposed; and
a heater control unit that adjusts an output of the heater unit such that the temperature detected in the temperature detector becomes a target temperature set in advance.

5. The oscillator device according to claim 1, wherein a frequency change rate of the frequency signal with respect to the frequency corresponding to the frequency setting value is 1 ppt/second or less.

6. The oscillator device according to claim 1, wherein the correction coefficient calculator calculates the aging coefficient based on an amount of change of the frequency correction value during an aging measurement period that is a period where the changing rate of the detected temperature within a preliminarily set period is equal to or less than a minimum temperature change rate set in advance.

7. The oscillator device according to claim 6, wherein the correction coefficient calculator calculates the temperature characteristic coefficient based on a temperature change factor frequency correction amount, the temperature change factor frequency correction amount being a value obtained by subtracting the aging factor frequency correction amount from the amount of change of the frequency correction value during a temperature characteristic measurement period where the changing rate of the detected temperature is larger than the minimum temperature change rate, the aging factor frequency correction amount being obtained based on an aging coefficient calculated in an aging measurement period before a start of the temperature characteristic measurement period and an elapsed time of the temperature characteristic measurement period.

8. The oscillator device according to claim 1, wherein the correction coefficient calculator obtains a plurality of the aging coefficients and a plurality of the temperature characteristic coefficients by repeating calculations of the aging coefficient and the temperature characteristic coefficient along an elapse of time, and the correction value calculator calculates the frequency correction value based on an average value of the plurality of aging coefficients and an average value of the plurality of temperature characteristic coefficients.

9. The oscillator device according to claim 1, further comprising:
a temperature control mechanism for changing the temperature of the atmosphere where the crystal resonator is disposed, wherein
the temperature control mechanism changes the temperature of the atmosphere where the crystal resonator is disposed during a period where the secular change of the difference value and the secular change of the detected temperature are obtained for calculating the temperature characteristic coefficient in the correction coefficient calculator.

\* \* \* \* \*